(12) United States Patent
Yong et al.

(10) Patent No.: US 12,743,020 B2
(45) Date of Patent: Sep. 22, 2026

(54) APPARATUS FOR TREATING SUBSTRATE AND METHOD FOR TREATING A SUBSTRATE

(71) Applicant: SEMES CO., LTD., Cheonan-si (KR)

(72) Inventors: Soo Bin Yong, Cheonan-si (KR); Min Jung Park, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 614 days.

(21) Appl. No.: 18/341,828

(22) Filed: Jun. 27, 2023

(65) Prior Publication Data

US 2024/0219838 A1 Jul. 4, 2024

(30) Foreign Application Priority Data

Dec. 29, 2022 (KR) ........................ 10-2022-0189826

(51) Int. Cl.
*G03F 7/16* (2006.01)

(52) U.S. Cl.
CPC .............. *G03F 7/162* (2013.01); *G03F 7/168* (2013.01)

(58) Field of Classification Search
CPC .......... G03F 7/162; G03F 7/168; G03F 7/161; H10P 72/0402; H10P 14/6508; H10P 14/683; H10P 14/6342; H10P 72/0448; H10P 76/204
USPC .......................................................... 430/327
See application file for complete search history.

(56) References Cited

U.S. PATENT DOCUMENTS

2018/0021804 A1* 1/2018 Hashimoto ............ B05D 1/005 427/425

FOREIGN PATENT DOCUMENTS

| | | | |
|---|---|---|---|
| JP | 2017-183498 | A | 10/2017 |
| KR | 10-2007-0021636 | A | 2/2007 |
| KR | 10-2011-0082838 | A | 7/2011 |
| KR | 10-2016-0149351 | A | 12/2016 |
| KR | 10-2016-0149353 | A | 12/2016 |
| KR | 102053495 | B1 | 12/2019 |
| KR | 10-2021-0028791 | A | 3/2021 |

OTHER PUBLICATIONS

Korean Office Action dated Oct. 6, 2024 issued for corresponding Korean Patent Appln. No. 10-2022-0189826.

* cited by examiner

*Primary Examiner* — Caleen O Sullivan
(74) *Attorney, Agent, or Firm* — Harness, Dickey & Pierce, P.L.C.

(57) ABSTRACT

The inventive concept provides a substrate treating method. The substrate treating apparatus includes supplying a first liquid to a rotating substrate to treat a substrate; and supplying a second liquid which is different from the first liquid to the rotating substrate to coat the substrate with the second liquid, and wherein a rotation direction of the substrate is different at the supplying the first liquid and at the supplying the second liquid.

12 Claims, 12 Drawing Sheets

APPARATUS FOR TREATING SUBSTRATE AND METHOD FOR TREATING A SUBSTRATE

CROSS-REFERENCE TO RELATED APPLICATIONS

A claim for priority under 35 U.S.C. § 119 is made to Korean Patent Application No. 10-2022-0189826 filed on Dec. 29, 2022, in the Korean Intellectual Property Office, the entire contents of which are hereby incorporated by reference.

TECHNICAL FIELD

Embodiments of the inventive concept described herein relate to a substrate treating apparatus and method, more specifically, a substrate treating apparatus and method for supplying a liquid to a substrate.

BACKGROUND

Various processes such as a photolithography process, an etching process, an ashing process, a thin film deposition process, and a cleaning process are performed to manufacture a semiconductor element or a flat plate display panel. Among these processes, the photolithography process involves sequentially or selectively performing a coating process of supplying a photoresist liquid to a semiconductor substrate to form a coating film on a substrate surface and an exposing process of exposing a coating layer using a mask, and then a developing process of obtaining a desired pattern on the semiconductor substrate by supplying a developing liquid.

If a chemical is supplied onto a substrate on which a fine pattern with a high aspect ratio is formed, it is difficult for the chemical to penetrate between the patterns. In particular, if the chemical is supplied to the substrate while rotating the substrate in a direction with an axis as a rotation axis, the chemical is filled only in a space of the pattern. An air void such as bubbles are formed in other spaces of the pattern in which the chemical does not easily penetrate. If a large amount of air voids are formed between the patterns, a space in which the air voids are formed is not filled with the chemical, and the chemical may not be uniformly coated on the substrate. This acts as a factor which hinders an efficient treatment of the substrate in subsequent processes.

SUMMARY

Embodiments of the inventive concept provide a substrate treating apparatus and method for efficiently treating a substrate.

Embodiments of the inventive concept provide a substrate treating apparatus and method for uniformly coating a liquid on a substrate.

Embodiments of the inventive concept provide a substrate treating apparatus and method for minimizing a generation of an air void between a pattern.

The technical objectives of the inventive concept are not limited to the above-mentioned ones, and the other unmentioned technical objects will become apparent to those skilled in the art from the following description.

The inventive concept provides a substrate treating method. The substrate treating method includes a supplying a first liquid to a rotating substrate to treat a substrate; and supplying a second liquid which is different from the first liquid to the rotating substrate to coat the substrate with the second liquid, and wherein a rotation direction of the substrate is different at the supplying the first liquid and at the supplying the second liquid.

In an embodiment, the supplying the first liquid includes: firstly supplying the first liquid on the rotating substrate to form a liquid film on the substrate; and secondly supplying the first liquid on the substrate having the liquid film formed thereon, after the firstly supplying the first liquid, and wherein the firstly supplying the first liquid and the secondly supplying the first liquid is performed before the supplying the second liquid.

In an embodiment, the substrate is rotated in a first direction at the firstly supplying the first liquid and the supplying the second liquid, and the substrate is rotated in a second direction which is different from the first direction at the secondly supplying the first liquid.

In an embodiment, an average rotation speed of the substrate at the firstly supplying the first liquid is the same or faster than an average rotation speed of the substrate at the secondly supplying the first liquid.

In an embodiment, the substrate is rotated at a first rotation speed and supplied with the first liquid at the firstly supplying the first liquid, and the substrate is rotated at a second rotation speed and supplied with the first liquid at the secondly supplying the first liquid, and wherein the supplying the first liquid further includes: firstly forming a liquid film on the substrate by rotating the substrate at a speed slower than the first rotation speed in a state at which a supply of the first liquid is stopped and which is performed after the firstly supplying the first liquid and before the secondly supplying the first liquid; firstly removing the liquid film formed on the substrate by rotating the substrate at a speed faster than the firstly forming the liquid film on the substrate in a state at which the supply of the first liquid is stopped and which is performed after the firstly forming the liquid film on the substrate and before the secondly supplying the first liquid; secondly forming the liquid film on the substrate by rotating the substrate at a speed slower than the second rotation speed in a state at which the supply of the first liquid is stopped and which is performed after the supplying the first liquid and before the supplying the second liquid; and secondly removing the liquid film formed on the substrate by rotating the substrate at a speed faster than the secondly forming the liquid film in a state at which the supply of the first liquid is stopped and which is performed after the secondly forming the liquid film and before the supplying the second liquid.

In an embodiment, the supplying the first liquid is performed before and after the supplying the second liquid, and the supplying the first liquid which is performed after the supplying the second liquid is performed by supplying the first liquid on the rotating substrate to remove a second liquid which is remaining on an edge region of the substrate.

In an embodiment, the substrate is rotated in the first direction at each of the supplying the first liquid which is performed before the supplying the second liquid and the supplying the second liquid, and the substrate is rotated in the second direction which is an opposite direction of the first direction at the supplying the first liquid which is performed after the supplying the second liquid.

In an embodiment, the substrate treating method further includes: diffusing the second liquid which is supplied to the substrate by rotating the substrate which is performed between the supplying the second liquid and the supplying the first liquid which is performed after the supplying the second liquid.

In an embodiment, the substrate treating method further includes: removing the first liquid which is supplied onto the substrate from the substrate by rotating the substrate after the supplying the first liquid which is performed after the supplying the second liquid.

In an embodiment, the first liquid is supplied to a center region of the substrate at the supplying the first liquid which is performed before the supplying the second liquid, and the first liquid is supplied to an edge region of the substrate at the supplying the first liquid which is performed after the supplying the second liquid.

In an embodiment, the first liquid is a thinner, and the second liquid is a photoresist liquid.

In an embodiment, an air void remaining between patterns formed on the substrate is removed by changing the rotation direction of the substrate.

The inventive concept provides a substrate treating method. The substrate treating method includes hydrophilizing a substrate by supplying a thinner to a rotating substrate; coating the substrate with a photoresist liquid by supplying the photoresist liquid to the rotating substrate; and post-treating the substrate, and wherein the post-treating the substrate includes: diffusing the photoresist liquid supplied onto the substrate by rotating the substrate; adjusting a thickness of the photoresist liquid supplied to the substrate by rotating the substrate; and removing a photoresist liquid remaining on an edge region of the substrate by supplying the thinner on the rotating substrate; and removing the thinner from the substrate by rotating the substrate, and wherein a rotation direction of the substrate is changed at any one of the hydrophilizing the substrate or the post-treating the substrate.

In an embodiment, the substrate rotates in a first direction at each of the hydrophilizing the substrate, the coating the substrate, the diffusing the photoresist liquid, and the adjusting the thickness, and the substrate rotates in a second direction which is an opposite direction of the first direction at the removing the photoresist liquid and the removing the thinner.

In an embodiment, the hydrophilizing the substrate includes: firstly supplying the thinner to the rotating substrate to form a liquid film on the substrate; firstly forming the liquid film on the substrate by rotating the substrate in a state in which a supply of the thinner is stopped; secondly supplying the thinner to a substrate on which the liquid film is formed after the firstly supplying the liquid film; secondly forming the liquid film on the substrate by rotating the substrate in a state in which the supply of the thinner is stopped, and wherein the substrate is rotated in a first direction at each of the firstly supplying the thinner, the firstly forming the liquid film, the coating the substrate, the diffusing the photoresist liquid, and the post-treating the substrate, and the substrate is rotated in a second direction which is an opposite direction from the first direction at each of the secondly supplying the thinner and the secondly forming the liquid film.

The inventive concept provides a substrate treating apparatus. The substrate treating apparatus includes a support unit configured to rotate a substrate; a first nozzle for supplying a first liquid to a center region of the substrate which is supported on the support unit; a second nozzle for supplying a second liquid which is different from the first liquid to an edge region of the substrate which is supported on the support unit; a third nozzle for supplying the first liquid to the edge region of the substrate supported on the support unit; and a controller for controlling the support unit, the first nozzle, the second nozzle, and the third nozzle, and wherein the controller controls the support unit, the first nozzle, the second nozzle, the third nozzle so the second liquid is supplied the center region of the rotating substrate and the first liquid is supplied to the edge region of the substrate which is supplied with the second liquid, after the first liquid is supplied to the center region of the rotating substrate, and a rotation direction of the support unit is changed at a portion of any section which supplies the first liquid to the substrate.

In an embodiment, the controller controls the first nozzle and the support unit so the support unit is rotated for a predetermined time and the first liquid is secondly supplied to the center region of the rotating substrate after the predetermined time, in a state in which a supply of the first liquid is stopped after the first liquid is firstly supplied to the center region of the rotating substrate, and the rotation direction of the substrate is changed at a second supply section of the first liquid.

In an embodiment, the controller controls the second nozzle and the support unit so the rotation direction of the substrate is changed at a section in which the second liquid is supplied to the center region after the second supply section.

In an embodiment, the controller controls the third nozzle and the support unit so the rotation direction of the substrate is changed at a section at which the first liquid is supplied at the edge region after the second liquid is supplied to the center region.

In an embodiment, the first liquid is a thinner and the second liquid is a photoresist liquid.

According to an embodiment of the inventive concept, a substrate may be efficiently treated.

According to an embodiment of the inventive concept, a liquid may be uniformly coated on a substrate.

According to an embodiment of the inventive concept, a generation of an air void between a pattern may be minimized.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
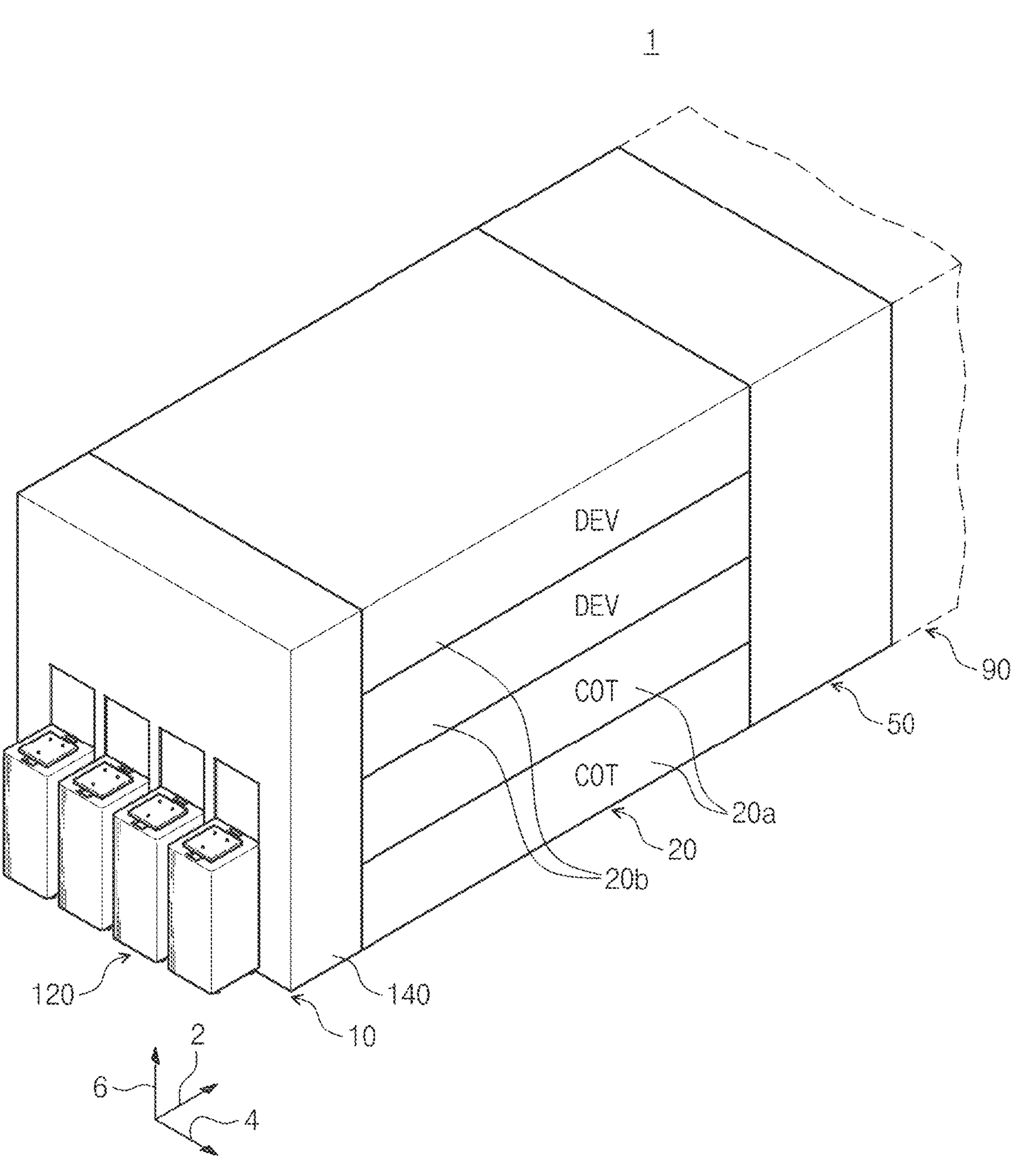
FIG. 1 is a perspective view schematically illustrating a substrate treating apparatus according to an embodiment.

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., +10%).

When the terms "about" or "substantially" are used in connection with a numerical value, it should be understood that the associated numerical value includes a manufacturing or operational tolerance (e.g., +10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the inventive concept will be described in detail with reference to the accompanying drawings.

The substrate according to an embodiment described below will be described with a circular substrate such as a semiconductor wafer as an example. However, the inventive concept is not limited thereto, and the substrate described in an embodiment of the inventive concept may be a rectangular substrate such as a mask or a display panel.

In an embodiment of the inventive concept, a substrate treating apparatus on which at least one of a coating process for forming a coating film on a surface of a substrate by supplying a photoresist liquid such as a photoresist liquid on the substrate, an exposure process for exposing with respect to the coating film, and a developing process for forming a desired pattern on the substrate may supplying a developing liquid on the substrate, is described as an example. However, the inventive concept is not limited to the above-described example, and the substrate treating apparatus according to an embodiment may be coated on various devices performing a predetermined process of the substrate.

Figure 2:
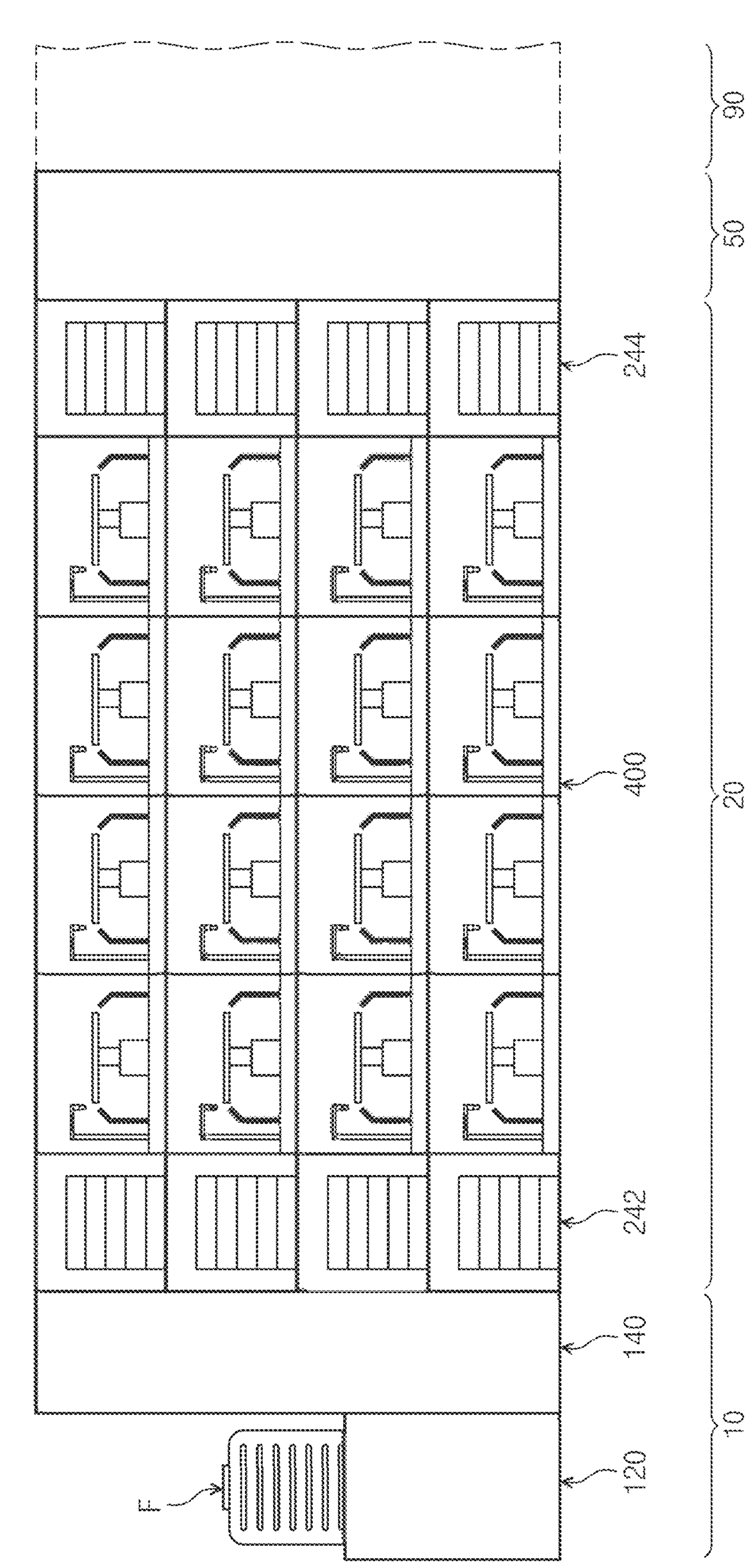
FIG. 2 is a cross-sectional view schematically showing a coating block or a developing block of FIG. 1.
Figure 3:
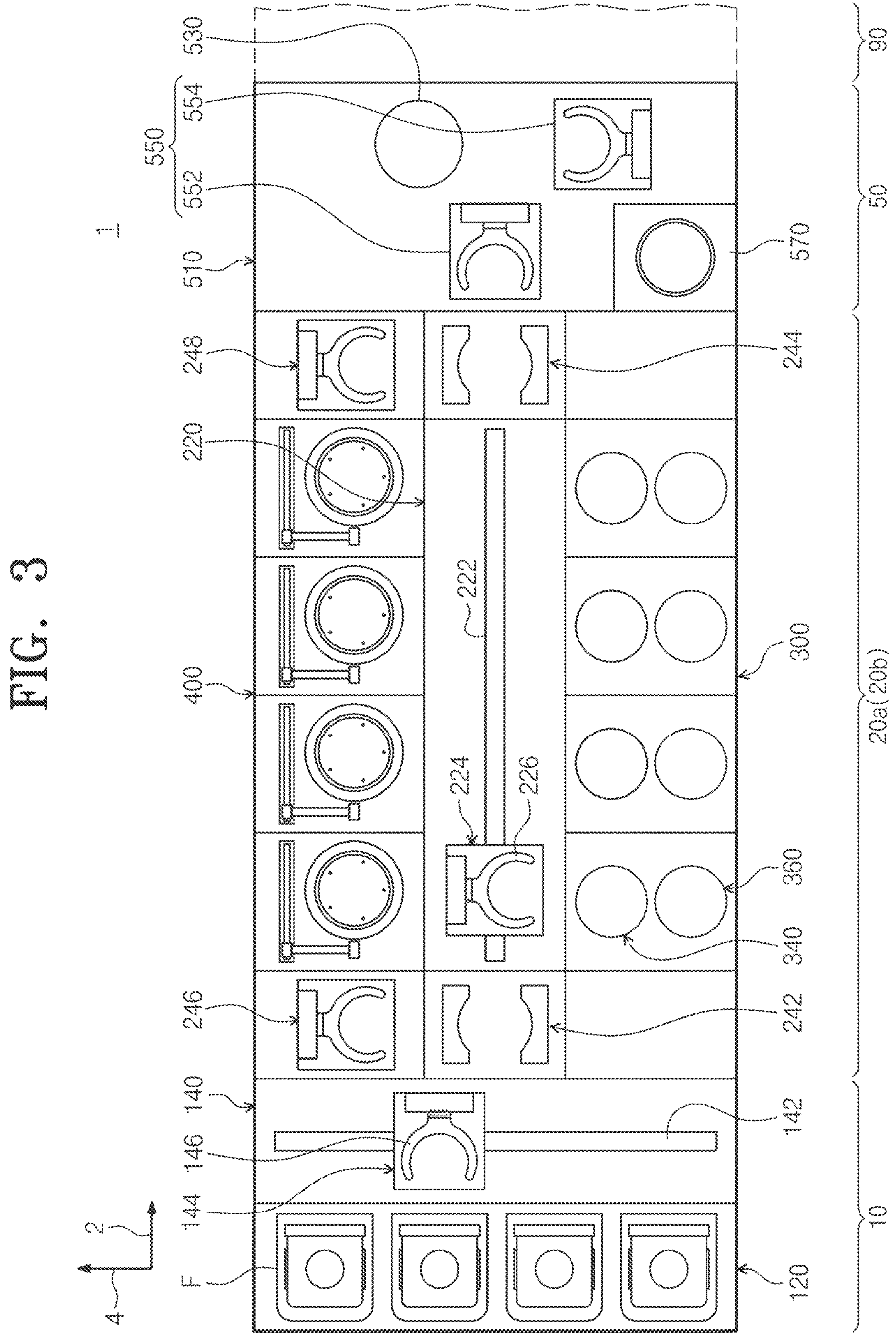
FIG. 3 is a plan view schematically showing the substrate treating apparatus of FIG. 1.

FIG. 1 is a perspective view schematically illustrating a substrate treating apparatus according to an embodiment. FIG. 2 is a cross-sectional view schematically showing the coating block or developing block of FIG. 1. FIG. 3 is a plan view schematically showing the substrate treating apparatus of FIG. 1.

The substrate treating apparatus 1 may include an index module 10, a treating module 20, and an interface module 50.

The index module 10, the treating module 20, and the interface module 50 are in a direction and sequentially positioned. Hereinafter, a direction in which the index module 10, the treating module 20, and the interface module 50 are disposed is defined as an X direction 2. Also, when viewed from above, a direction perpendicular to the X direction 2 is defined as a Y direction 4, and a direction perpendicular to a plane including both the X direction 2 and the Y direction 4 is defined as a Z direction 6. For example, the Z direction 6 may be a direction perpendicular to the ground.

The index module 10 transfers the substrate between the container F and the treating module 20. More specifically, the index module 10 takes out the substrate from the container F and transfers the substrate which is taken out to the treating module 20 for treating the substrate. In addition, the index module 10 taken out the substrate on which a predetermined treatment has been completed from the treating module 20 and transfers the substrate to the container F. The index module 10 has a load port 120 and an index frame 140.

A container F in which the substrate is stored is accommodated in the load port 120. The load port 120 is disposed on an opposite side of the treating module 20 based on an index frame 140 to be described later. A plurality of load ports 120 may be provided, and the plurality of load ports 120 are positioned in a line along the Y direction 4. The number of load ports 120 may increase or decrease according to a process efficiency or footprint conditions of the treating module 20.

The substrate is stored in the container F. As the container F stored in the load port 120 according to an embodiment, a sealing container such as a front opening unified pod (FOUP) may be used. The container F may be stored in the load port 120 by a means of transfer such as an overhead transfer, an overhead conveyor, or an automatic guided vehicle or by an operator.

The index frame 140 its lengthwise direction horizontal to the Y direction 4. An index rail 142 and an index robot 144 are disposed inside the index frame 140. The index rail 142 its lengthwise direction parallel to the lengthwise direction of the index frame 140. The index robot 144 transfers the substrate. More specifically, the index robot 144 may transfer the substrate between the container F stored in the load port 120 and a front buffer 242 to be described later. The index robot 144 forwardly and backwardly moves on the index rail 142 along the lengthwise direction of the index rail 142.

The index robot 144 has an index hand 146. The substrate is placed on the index hand 146. The index hand 146 forwardly and backwardly moves, rotates about the Z direction 6, and moves up and down along the Z direction 6.

The treating module 20 perform a coating process and/or a developing process on the substrate. According to an embodiment, the treating module 20 may include a coating block 20*a* and a developing block 20*b*. The coating block 20*a* performs the coating process on the substrate. The developing block 20*b* performs a developing process on the substrate.

A plurality of coating blocks 20*a* and a plurality of developing blocks 20*b* may be provided, and the plurality of coating blocks 20*a* and the plurality of developing blocks 20*b* may be disposed to be stacked on each other. According to an embodiment, the coating blocks 20*a* may be disposed below the developing blocks 20*b*. In addition, each of the coating blocks 20*a* has the same or similar structure, and may perform the same or similar process. In addition, each of the developing blocks 20*b* has the same or similar structure, and may perform the same or similar process. However, the inventive concept is not limited thereto, and each coating block 20*a* may perform different processes, and each developing block 20*b* may perform different processes. In addition, the number and arrangement of the coating blocks 20*a* and the number and arrangement of the developing blocks 20*b* may be variously changed.

Since the coating block 20*a* and the developing block 20*b* according to an embodiment are generally configured to have the same or similar structure and arrangement with each other, a description of the developing block 20*b* will be omitted hereinafter, and the coating block 20*a* will be mainly described to avoid repeated explanations.

The coating block 20*a* has a transfer chamber 220, buffer chambers 242 and 244, a heat-treating chamber 300, and a liquid treating chamber 400.

The transfer chamber 220 has its lengthwise direction parallel to the X direction 2. A guide rail 222 having its lengthwise direction parallel to the X direction 2 and a transfer robot 224 are disposed in the transfer chamber 220. The transfer robot 224 transfers the substrate between the buffer chambers 242 and 244, the heat-treating chamber 300, and the liquid treating chamber 400. The transfer robot 224 forwardly and backwardly moves along the lengthwise direction of the guide rail 222 on the guide rail 222. The transfer robot 224 has a transfer hand 226 on which the substrate is placed. Since the structure of the transfer hand 226 has the same or similar structure as that of the index hand 146 described above, a redundant description thereof will be omitted.

The buffer chambers 242 and 244 provide a space at which the substrate taken into the coating block 20*a* and a substrate taken out from the coating block 20*a* temporarily remain. A plurality of buffer chambers 242 and 244 may be provided. Some of the buffer chambers 242 and 244 are disposed between the index frame 140 and the transfer chamber 220. Hereinafter, these buffer chambers are defined as front buffers 242. In addition, another portion of the buffer chambers 242 and 244 are disposed between the transfer chamber 220 and the interface module 50 to be described later. Hereinafter, these buffer chambers are defined as rear buffers 244. A plurality of front buffers 242 may be provided, and the plurality of front buffers 242 may be stacked in a vertical direction. In addition, the plurality of rear buffers 244 may be provided, and the plurality of rear buffers 244 may be stacked in a vertical direction.

Each of the front buffer 242 and the rear buffer 244 temporarily stores a plurality of substrates. A substrate stored in the front buffer 242 is taken in or taken out by the index robot 144 and the transfer robot 224. In addition, a substrate stored in the rear buffer 244 is taken in or taken out by the transfer robot 224 and the first robot 552 to be described later.

The buffer robots 246 and 248 may be disposed on a side of the buffer chambers 242 and 244. According to an embodiment, a front buffer robot 246 may be disposed on a side of the front buffer 242, and a rear buffer robot 248 may be disposed on a side of the rear buffer 244. However, the inventive concept is not limited thereto, and buffer robots may be disposed on both sides of the front buffer 242 and the rear buffer 244, respectively.

The front buffer robot 246 transfers the substrate between the front buffers 242. More specifically, the front buffer robot 246 transfers the substrate between the front buffers 242 arranged to be stacked while moving along the Z direction 6. In addition, the rear buffer robot 248 transfers the substrate between the rear buffers 244 arranged to be stacked while moving along the Z direction 6.

The heat-treating chamber 300 performs a heat treatment process to adjust a temperature of the substrate. The heat treatment process according to an embodiment may include a cooling process of lowering a temperature of the substrate and a heating process of increasing the temperature of the substrate. A plurality of heat-treating chambers 300 may be provided. The heat-treating chambers 300 are disposed along the X direction 2. In addition, the heat-treating chambers 300 are arranged to be stacked in the Z direction 6. The heat-treating chambers 300 are positioned on a side of the transfer chamber 220.

The liquid treating chamber 400 performs a liquid treatment process of supplying a liquid on the substrate. A plurality of liquid treating chambers 400 may be provided. The liquid treating chambers 400 are disposed along the X direction 2. In addition, the liquid treating chambers 400 are arranged to be stacked in the Z direction 6. The liquid treating chambers 400 are positioned on the other side of the transfer chamber 200. That is, the heat-treating chamber 300 and the liquid treating chamber 400 are disposed to face each other based on the transfer chamber 220.

Figure 4:
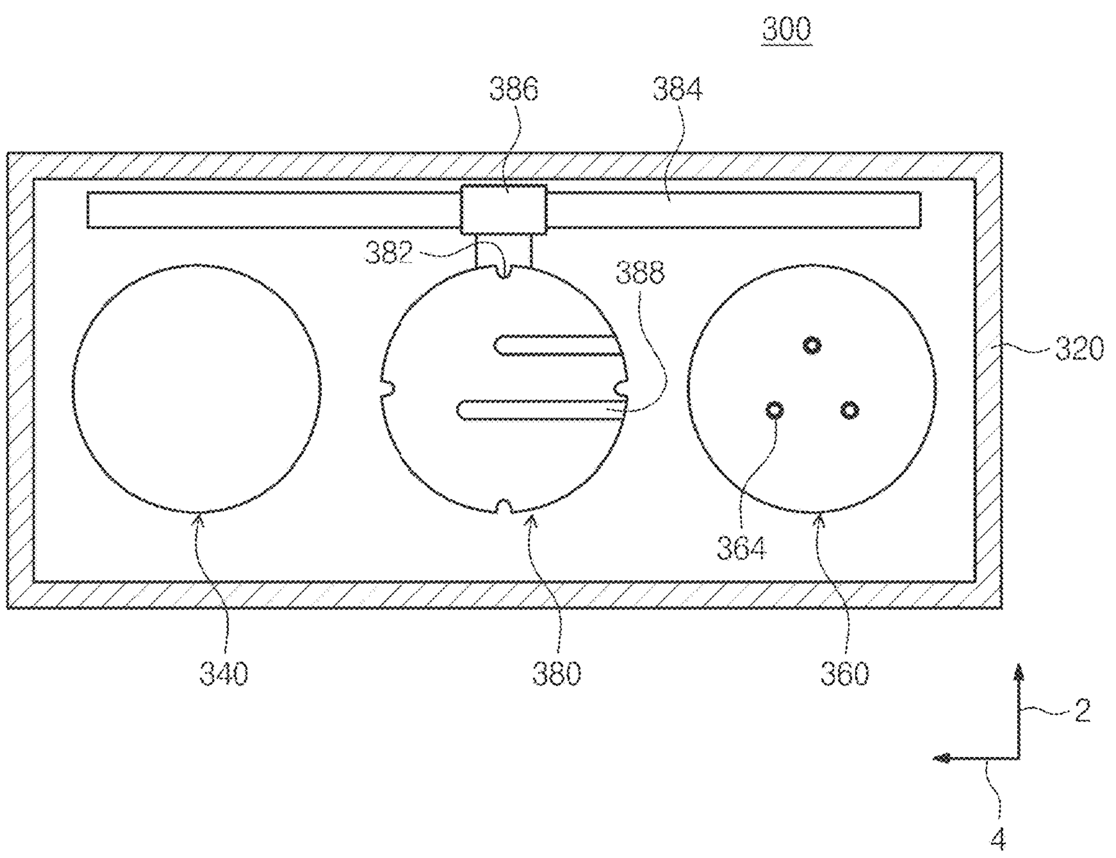
FIG. 4 is a plan view schematically illustrating a heat-treating chamber according to an embodiment.
Figure 5:
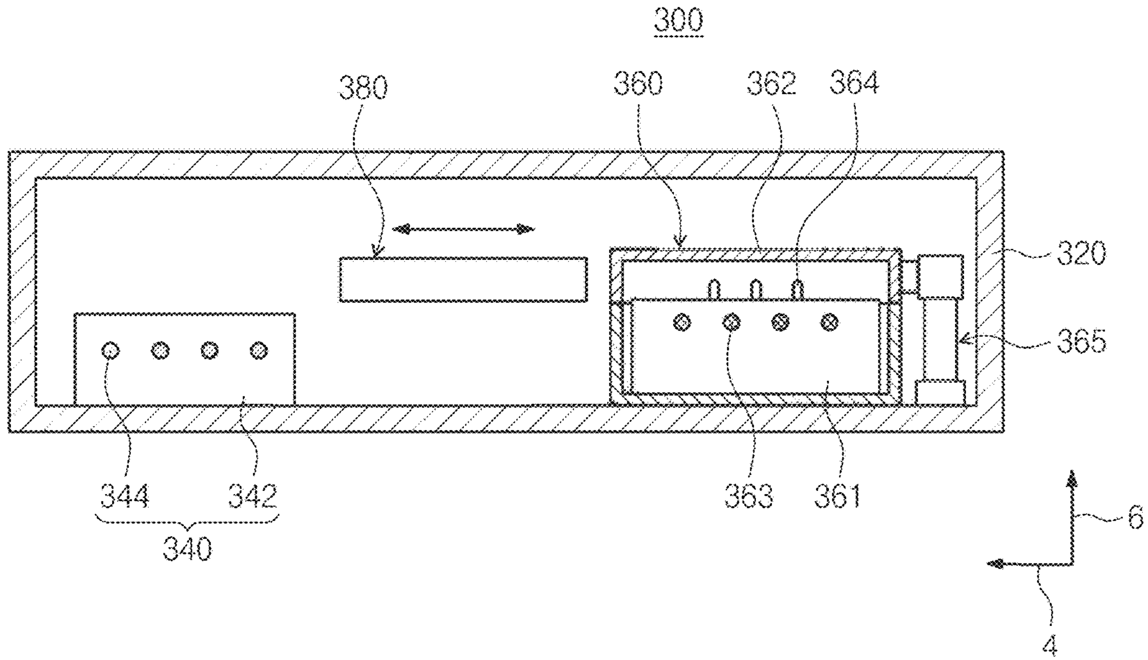
FIG. 5 is a front view schematically illustrating the heat-treating chamber according to an embodiment.

FIG. 4 is a plan view schematically illustrating a heat-treating chamber according to an embodiment. FIG. 5 is a front view schematically illustrating a heat-treating chamber according to an embodiment.

The heat-treating chamber 300 includes a housing 320, a cooling unit 340, a heating unit 360, and a transfer plate 380.

The housing 320 has a generally rectangular parallelepiped shape. Also, the housing 320 has an inner space. An entrance (not shown) through which the substrate enters and exits is formed on the sidewall of the housing 320. A cooling unit 340, a heating unit 360, and a transfer plate 380 are positioned in an inner space of the housing 320. The cooling unit 340 and the heating unit 360 are positioned side by side in the Y direction 4.

According to an embodiment, the cooling unit 340 may be positioned closer to the transfer chamber 220 than the heating unit 360. The cooling unit 340 includes a cooling plate 342 and a cooling fluid channel 344. The cooling plate 342 may have a substantially circular shape when viewed from above. The cooling fluid channel 344 is positioned inside the cooling plate 342. A cooling fluid may flow through the cooling fluid channel 344. The cooling fluid may flow within the cooling fluid channel 344 to lower a temperature of the cooling plate 342.

The heating unit 360 may include a heating plate 361, a cover 362, and a heater 363.

The heating plate 361 may have a circular shape when viewed from above. The heating plate 361 may have a diameter larger than that of the substrate. A heater 363 is disposed inside the heating plate 361. The heater 363 may be any one of known heating element which generate a heat by resisting a current.

A plurality of lifting/lowering pins 364 moving up and down along the Z direction 6 are disposed on the heating plate 361. The lifting/lowering pins 364 may receive the substrate from a transfer means (e.g., transfer plate 380) outside the heating unit 360, and transfer the substrate to the heating plate 361. In addition, the lifting/lowering pins 364 may lift the substrate from the heating plate 361 and transfer the substrate to a transfer means outside the heating unit 360.

The cover 362 has a shape in which a bottom portion is opened. The cover 362 is positioned above the heating plate 361 and can be moved in the vertical direction by the driver 365 coupled to the cover 362. The driver 365 may be any one of known motors which transfer a driving force. If the cover 362 is downwardly moved by the driver 365, a closed space may be formed by combining the cover 362 and the heating plate 361. The space which is formed by a combination of the cover 362 and the heating plate 361 may function as a heating space for heating the substrate.

The transfer plate 380 generally has a disk shape. In addition, the transfer plate 380 may have a diameter corresponding to the substrate. A notch 382 is formed at an edge of the transfer plate 380. In addition, a plate driver 386 may be coupled to the transfer plate 380. The plate driver 386 is mounted on the rail 384 having a lengthwise direction horizontal to the Y direction 4. Accordingly, the transfer plate 380 may be linearly moved along the rail 384 by the plate driver 386.

In addition, a plurality of slit-shaped guide grooves 388 are formed in the transfer plate 380. The guide groove 388 extends from an end of the transfer plate 380 to an inside of the transfer plate 380. The guide groove 388 has a lengthwise direction horizontal to the Y direction 4, and the plurality of guide grooves 388 are formed to be spaced apart along the X direction 2. If the substrate is taken over and handed over between the transfer plate 380 and the heating unit 360, the transfer plate 380 and the pin 364 can be prevented from interfering with each other by the guide groove 388 formed in the transfer plate 380.

The transfer plate 380 transfers the substrate to the pin 364, and the pin 364 downwardly moves to mount the substrate on the heating plate 361. A temperature of the substrate mounted on the heating plate 361 may be increased by a heat generation of the heater 363. In addition, the transfer plate 380 may be in contact with the cooling plate 342. More specifically, if the substrate is placed on a top side of the transfer plate 380, the transfer plate 380 may contact the cooling plate 342. The temperature of the substrate mounted on the transfer plate 380 may be lowered by a cooling fluid flowing through the cooling fluid channel 344.

In addition, according to an embodiment, the heating unit 360 provided in some of the plurality of heat-treating chambers 300 may improve an adhesion rate of the photoresist liquid to the substrate by supplying a gas while heating the substrate. According to an embodiment, the gas may be a hexamethyldisilane.

Figure 6:
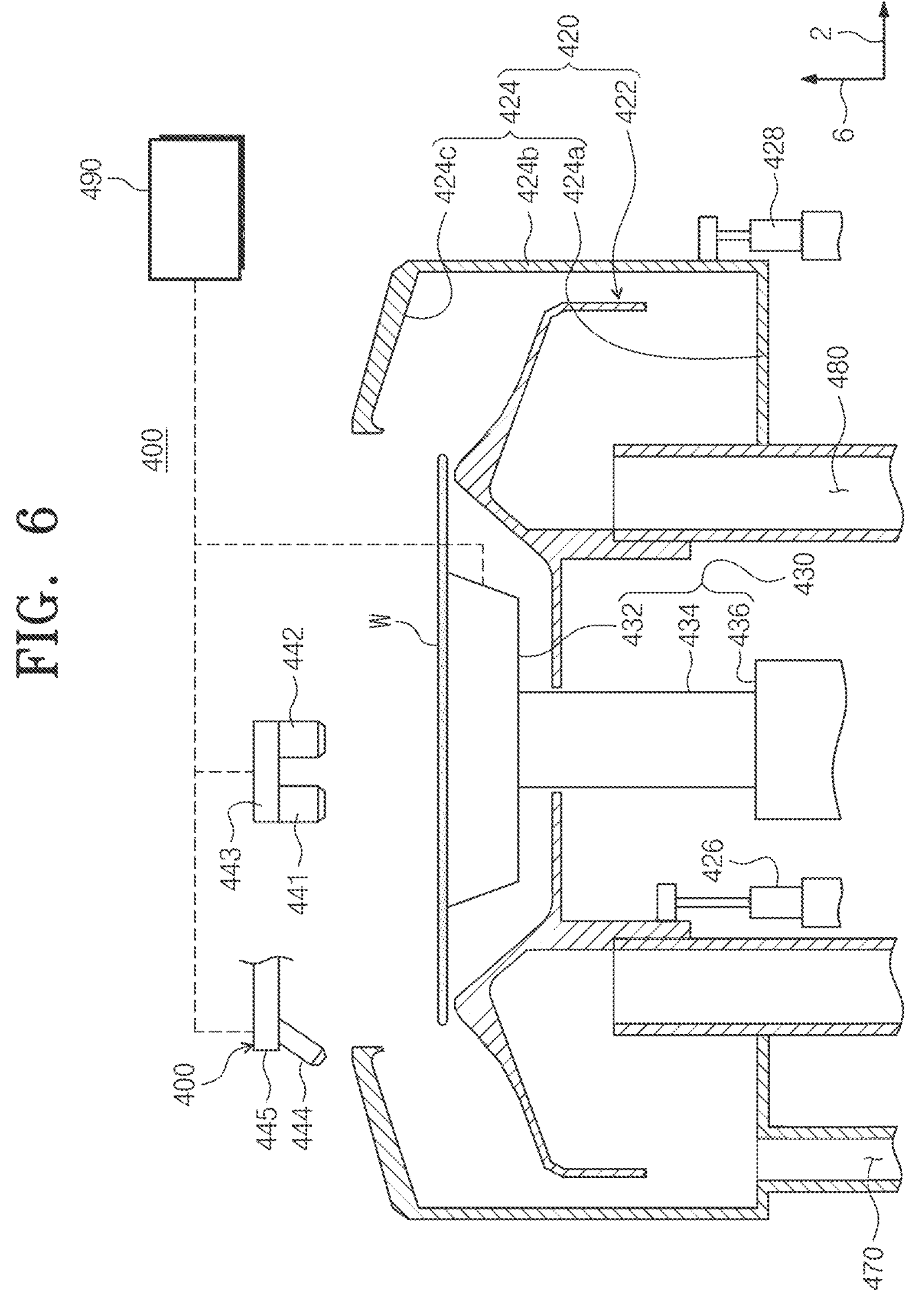
FIG. 6 is a cross-sectional view schematically illustrating a liquid treating chamber according to an embodiment.

FIG. 6 is a cross-sectional view schematically illustrating a liquid treating chamber according to an embodiment.

The liquid treating chamber 400 may include a treating container 420, a support unit 430, a liquid supply unit 440, and a controller 490.

The treating container 420, the support unit 430, and the liquid supply unit 440 may be disposed inside a rectangular parallelepiped-shaped housing, which is not shown. In addition, an entrance through which the substrate W is taken in and out is formed on a sidewall of the housing (not shown). In addition, a fan filter unit for supplying an airflow to an inside of the housing (not shown) may be installed on a top wall of the housing (not shown), and a hole for exhausting an inner atmosphere of the housing (not shown) may be formed on a bottom wall of the housing (not shown).

The treating container 420 has a cup shape with an open top port. An inside of the treating container 420 functions as a treating space in which the substrate W is treated. The treating space may function as a space in which the support unit 430 to be described later supports and rotates the substrate W. In addition, the treating space may function as a space in which the liquid supply unit 440 to be described later supplies a liquid to the substrate W to treat the substrate W.

The treating container 420 may include an inner cup 422 and an outer cup 424.

The inner cup 422 is positioned within the outer cup 424. The inner cup 422 may surround a chuck 432 to be described later. In addition, the inner cup 422 may have a disk shape surrounding the rotation shaft 434 to be described later.

The inner cup 422 may have an inner portion and an outer portion. The top surfaces of each of the inner portion and the outer portion may have different angles with respect to a virtual horizontal line. According to an embodiment, the inner portion may be positioned in a region overlapping the chuck 432 to be described later when viewed from above. In addition, the top surface of the inner portion may be upwardly inclined as it moves away from the rotation shaft 434.

The outer portion outwardly extends from the inner portion. According to an embodiment, the top surface of the outer portion may be downwardly inclined as the outer portion moves away from the rotation shaft 434. A top end of the inner portion may be positioned to overlap a side end of the substrate W when viewed from above. That is, the top end of the inner portion may coincide with the side end of the substrate W in the vertical direction. According to an embodiment, a point at which the inner portion and the outer portion meet may be a position lower than a top end of the inner portion. In addition, a point at which the inner portion and the outer portion meet may be formed to be rounded. A space between the outer portion and the outer cup 424 functions as a recollecting path through which a liquid introduced into the treating space is recollected.

In addition, the inner cup 422 may be disposed to overlap an exhaust line 480 when viewed from above. A pump (not shown) is installed in the exhaust line 480. The pump (not shown) may apply a negative pressure to a space between the outer portion and the outer cup 424 through the exhaust line 480. That is, an inner atmosphere of the treating container 420 may be exhausted through the exhaust line 480, and an outer atmosphere of the treating container 420 may be exhausted through a hole (not shown) formed in a bottom wall of the housing (not shown).

The outer cup 424 may have a shape surrounding the inner cup 422. The outer cup 424 has a bottom portion 424*a*, a side portion 424*b*, and an inclined portion 424*c*. The bottom portion 424*a* may be formed in a disk shape having a hollow. A recollecting line 470 is connected to the bottom portion 424*a*. The recollecting line 470 recollects a liquid supplied on the substrate W. The liquid recollected by the recollecting line 470 may be reused by an outer regeneration system (not shown).

The side portion 424*b* and the inclined portion 424*c* may have a substantially ring shape. The side portion 424*b* upwardly extends from an end of the bottom portion 424*a*. The inclined portion 424*c* extends from the top end of the side portion 424*b*. For example, the inclined portion 424*c* may extend from the top end of the side portion 424*b* toward a central axis of the rotation shaft 434 to be described later. In addition, the inclined portion 424*c* may be upwardly inclined with respect to the ground toward the central axis of the rotation shaft 434.

An inner lifting/lowering unit 426 is coupled to the inner cup 422. In addition, an outer lifting/lowering unit 428 is coupled to the outer cup 424. The inner lifting/lowering unit 426 may lift/lower the inner cup 422. In addition, the outer lifting/lowering unit 428 may lift/lower the outer cup 424. The inner lifting/lowering unit 426 and the outer lifting/lowering unit 428 may be any one of known motors which transmit a driving force, respectively. According to an embodiment, while treating the substrate W, the outer lifting/lowering unit 428 may upwardly move the outer cup 424. Accordingly, a top end of the inclined portion 424*c* may be positioned higher than a top surface of the substrate W supported by the support unit 430 while treating the substrate W. On the contrary, after the treating of the substrate W is completed, the outer lifting/lowering unit 428 may downwardly move the outer cup 424 so that the top end of the inclined portion 424*c* is positioned lower than the top surface of the substrate W supported by the support unit 430.

The support unit 430 supports and rotates the substrate W. The support unit 430 may include a chuck 432, a rotation shaft 434, and a shaft driver 436.

The substrate W is seated on a top surface of the chuck 432. If viewed from above, the top surface of the chuck 432 has a substantially circular shape. In addition, the top surface of the chuck 432 may have a diameter smaller than that of the substrate W. The rotation shaft 434 is coupled to a bottom end of the chuck 432. The rotation shaft 434 has a lengthwise direction parallel to the Z direction 6. The rotation shaft 434 may rotate by receiving a power from the shaft driver 436. According to an embodiment, the shaft driver 436 may be a rotation motor capable of transmitting a rotational force to the rotation shaft 434. In addition, the shaft driver 436 may be a rotation motor capable of varying a rotation speed of the rotation shaft 434. As the rotation shaft 434 is rotated by the shaft driver 436, the substrate W may also rotate with the axial direction of the rotation shaft 434 as the center axis.

The liquid supply unit 440 supplies a liquid to the substrate W supported by the support unit 430. According to an embodiment, the liquid may include a first liquid and a second liquid.

The first liquid according to an embodiment may be a liquid that changes the surface properties of the substrate W. In addition, the first liquid may be a liquid which dilutes the second liquid. In addition, the first liquid may be a liquid which increases an adhesive force between the substrate W and the second liquid. That is, the first liquid is supplied to the substrate W and may be a liquid to pre-treat the substrate W. For example, the first liquid may be thinner.

The second liquid according to an embodiment may be a liquid which is sensitive to a specific light having a specific wavelength. In addition, the second liquid according to an embodiment may have hydrophobic properties. For example, the second liquid may be a photosensitive liquid such as a photoresist (PR).

The first liquid supply unit 440 may include a first nozzle 441, a second nozzle 442, and a third nozzle 444.

The first nozzle 441 supplies the first liquid to the substrate W supported by the support unit 430. More specifically, the first nozzle 441 supplies the first liquid to a center region of the rotating substrate W. The first liquid supplied to the center region flows from the center region of the substrate W to the edge region of the substrate W by a centrifugal force. Accordingly, the first liquid may be uniformly supplied to an entire region of the substrate W.

The second nozzle 442 supplies the second liquid to the substrate W supported by the support unit 430. More specifically, the second nozzle 442 supplies the second liquid to the center region of the rotating substrate W. The second liquid supplied to the center region may be uniformly coated on the entire region of the substrate W by the centrifugal force.

The first nozzle 441 and the second nozzle 442 are supported by a first arm 443. A first nozzle 441 and the second nozzle 442 are installed at an end of the first arm 443. The first arm 443 may be coupled to a first nozzle driver, which is not shown, and its position may be changed. Accordingly, a position of the first nozzle 441 and the second nozzle 442 is also changed, and so a position of the liquid supplied to the substrate W may be changed. For example, if the first nozzle 441 supplies the first liquid to the substrate W, the position of the first nozzle 441 may be changed so that the center region of the substrate W and first nozzle 441 overlap when viewed from above. In contrast, if the second nozzle 442 supplies the second liquid to the substrate W, the position of the second nozzle 442 may be changed so that the center region of the substrate W and the second nozzle 442 overlap when viewed from above.

The third nozzle 444 supplies the first liquid to the substrate W supported by the support unit 430. More specifically, the third nozzle 444 supplies the first liquid to an edge region of the rotating substrate W. The first liquid supplied to the edge region may react with the previously supplied second liquid to remove the first liquid remaining in the edge region of the substrate W. A detailed mechanism for this will be described later. The third nozzle 444 according to an embodiment may be formed to be inclined. More specifically, the third nozzle 444 may be formed to be inclined in a direction toward the edge region of the substrate W. However, the inventive concept is not limited thereto, and the third nozzle 444 may not be formed to be inclined.

The third nozzle 444 is supported by the second arm 445. A third nozzle 444 is installed at an end of the second arm 445. The second arm 445 may be coupled to a second nozzle driver, which is not shown, and its position may be changed. A position of the third nozzle 444 installed in the second arm 445 may also be changed according to a driving of the second nozzle driver (not shown). For example, if the third nozzle 444 supplies the first liquid to the substrate W, the position of the third nozzle 444 may be changed so that the edge region of the substrate W and third nozzle 444 overlap when viewed from above.

Unlike the above-described example, the number of nozzles supplying the liquid to the substrate W may be variously changed. For example, the number of nozzles may be at least N or more (N is a natural number of 24 or more). Each of the nozzles may supply different liquids including the first liquid and the second liquid to the substrate W. Also, some nozzles may supply the same liquid to the substrate W, but they may be supplied having a different composition ratio to the substrate W.

The controller 490 may control the support unit 430, the first nozzle 441, the second nozzle 442, and the third nozzle 444. The controller (not shown) may comprise a process controller consisting of a microprocessor (computer) that executes a control of the support unit 430, the first nozzle 441, the second nozzle 442, and the third nozzle 444, including a user interface such as a keyboard via which an operator inputs commands to manage the substrate treating apparatus, and a display showing the operation situation of the substrate treating apparatus, and a memory unit storing a treating recipe, i.e., a control program to execute treating processes of the substrate treating apparatus by controlling the process controller or a program to execute components of the substrate treating apparatus according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory. A specific mechanism by which the controller 490 controls the support unit 430, the first nozzle 441, the second nozzle 442, and the third nozzle 444 to treat the substrate W will be described later.

Referring back to FIG. 1 to FIG. 3, the interface module 50 connects the treating module 20 to an outer exposure apparatus 90. The interface module 50 includes an interface frame 510, an interface buffer 530, a transfer unit 550, and an additional process chamber 570.

The interface buffer 530, the transfer unit 550, and the additional process chamber 570 are positioned inside the interface frame 510. The interface buffer 530 provides a space in which the substrate is temporarily stored in a process of transferring the substrate between the coating block **20*a*, the additional process chamber 570, the exposure apparatus 90, and the developing block 20*b*. A plurality of interface buffers 530 may be provided, and the plurality of interface buffers 530** may be disposed to be stacked on each other.

The transfer unit 550 transfers the substrate between the coating block **20*a*, the additional process chamber 570, the exposure apparatus 90 or the developing block 20*b*. The transfer unit 550 includes at least one robot. According to an embodiment, the transfer unit 550 may include a first robot 552, a second robot 554**, and a third robot (not shown).

The first robot 552 may transfer the substrate between the coating block **20*a*, the additional process chamber 570, and the exposure apparatus 90. More specifically, the first robot 552 may transfer the substrate between the rear buffer 244, the additional process chamber 570, and the exposure apparatus 90. In addition, the second robot 554 may transfer the substrate between the interface buffer 530 and the exposure apparatus 90. The third robot, which is not shown, may transfer the substrate between the interface buffer 530 and the developing block 20*b*. Each of the first robot 552, the second robot 554, and the third robot (not shown) may include a hand on which a substrate is placed. Each hand forwardly and backwardly moves, rotates around an axis parallel to the Z direction 6, and vertically moves along the Z direction 6**.

The additional process chamber 570 may perform a predetermined additional process before the substrate which has completed a predetermined process at the coating block **20*a* is taken into the exposure apparatus 90. In addition, the additional process chamber 570 may perform a predetermined additional process before the substrate that has been treated by the exposure apparatus 90 is taken into the developing block 20***b*.

A plurality of additional process chambers 570 may be provided. In addition, the plurality of additional process chambers 570 may be disposed to be stacked on each other. All of the additional process chambers 570 may perform the same process. Selectively, the additional process chambers 570 may perform different processes. For example, in some of the plurality of additional process chambers 570, an additional process according to an embodiment be performing an edge exposure process of exposing an edge region of the substrate. In addition, in other parts of the plurality of additional process chambers 570, a top surface cleaning process of cleaning a top surface of the substrate may be performed. In addition, in another part of the plurality of additional process chambers 570, a bottom surface cleaning process of cleaning a bottom surface of the substrate may be performed.

Hereinafter, a substrate treating method according to an embodiment will be described. The substrate treating method described below may be performed by the substrate treatment apparatus described with reference to FIG. 2 to FIG. 7. Accordingly, hereinafter, the substrate treating method according to an embodiment will be described by citing the reference numerals shown in FIG. 2 to FIG. 7. In addition, the substrate treating method described below can be performed by controlling the support unit 430, the first nozzle 441, the second nozzle 442, and the third nozzle 444 described above by the controller 490.

Figure 7:
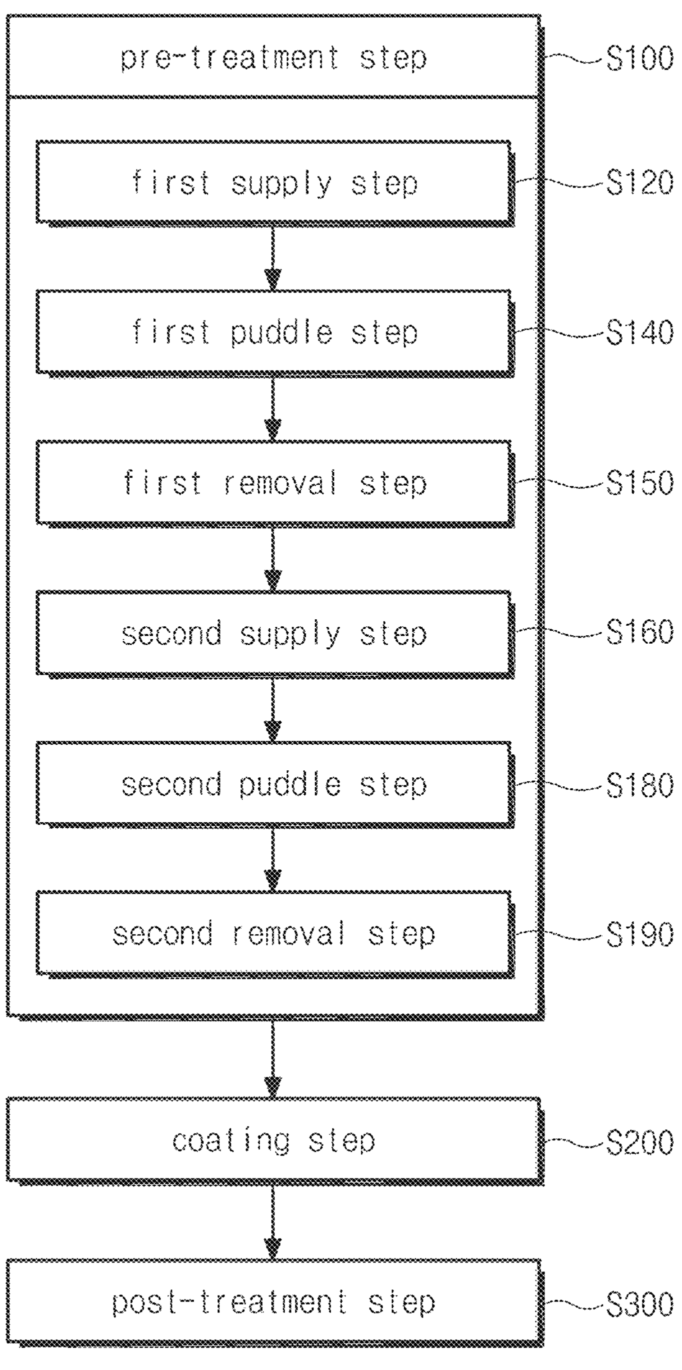
FIG. 7 is a flowchart of a substrate treating method according to an embodiment.
Figure 8:
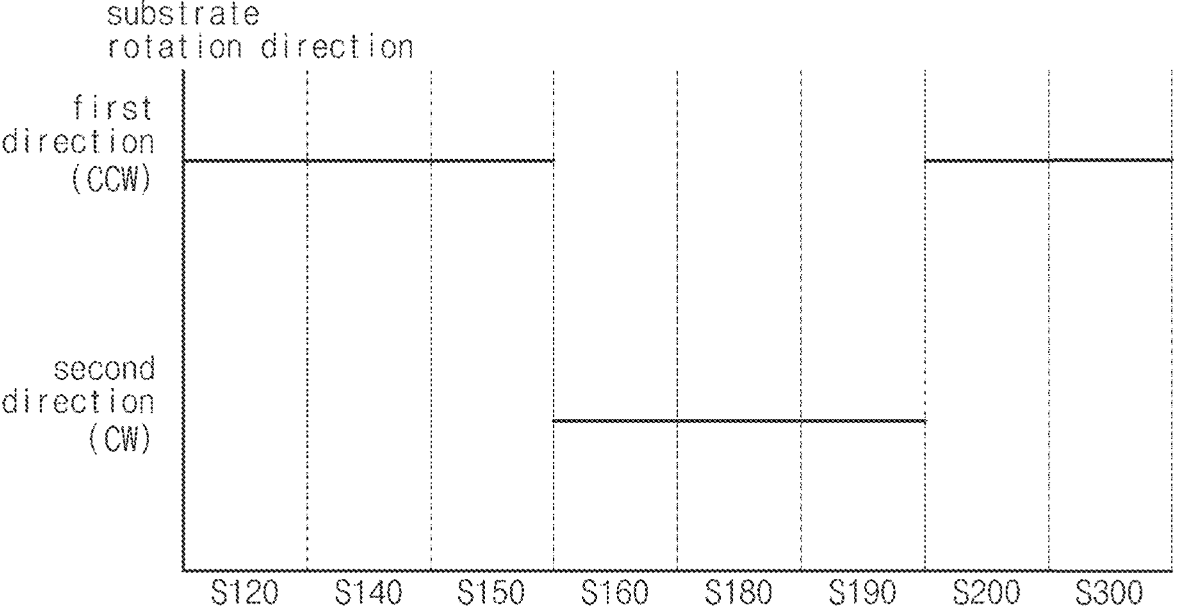
FIG. 8 is a graph illustrating a direction in which a substrate rotates while performing the substrate treating method of FIG. 7.
Figure 9:
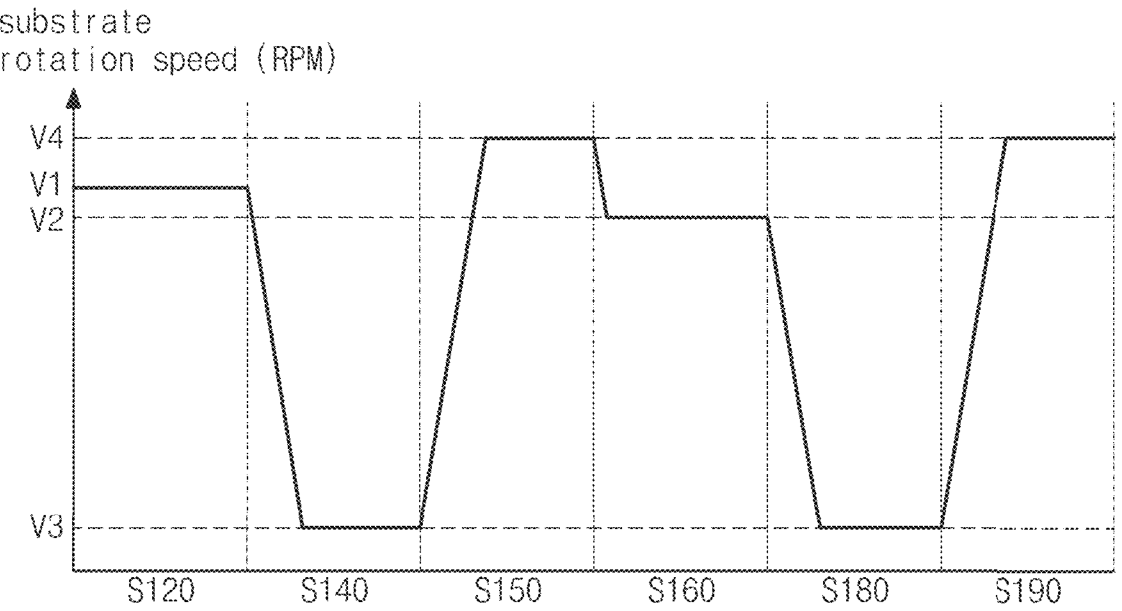
FIG. 9 is a graph illustrating a rotation speed of the substrate in a pre-treatment step of FIG. 7.
Figure 10:
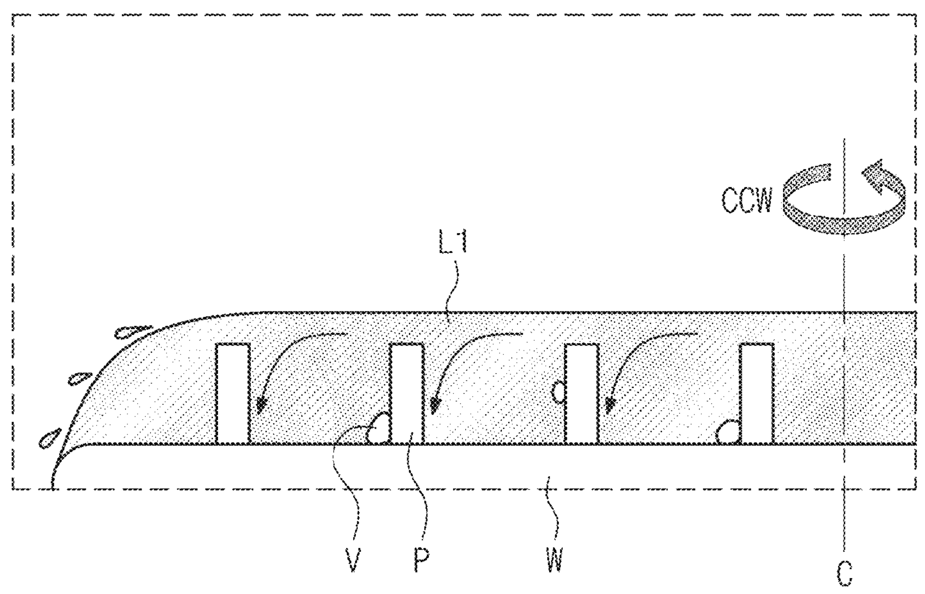
FIG. 10 is an enlarged view schematically illustrating a state in which a first liquid supplied to the substrate flows on the substrate in a first supply step of FIG. 7.
Figure 11:
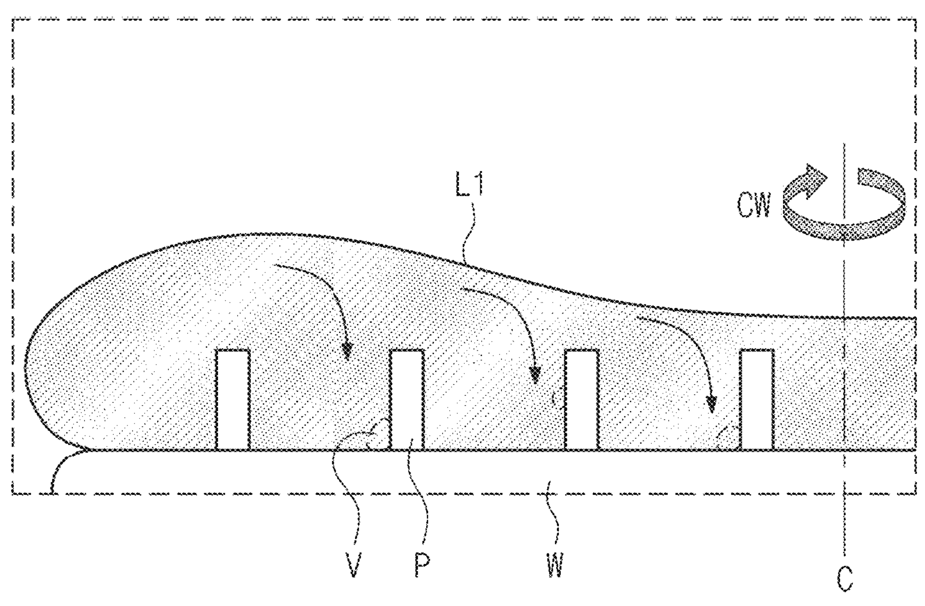
FIG. 11 is an enlarged view schematically illustrating a state in which the first liquid supplied to the substrate flows on the substrate in a second supply step of FIG. 7.

FIG. 7 is a flowchart of a substrate treating method according to an embodiment. FIG. 8 is a graph illustrating a direction in which a substrate rotates while performing the substrate treating method of FIG. 7. FIG. 9 is a graph illustrating a rotation speed of the substrate in a pre-treatment step of FIG. 7. FIG. 10 is an enlarged view schematically illustrating a state in which a first liquid supplied to the substrate flows on the substrate in a first supply step of FIG. 7. FIG. 11 is an enlarged view schematically illustrating a state in which the first liquid supplied to the substrate flows on the substrate in a second supply step of FIG. 7.

The substrate treating method according to an embodiment includes a pre-treatment step S100, a coating step S200, and a post-treatment step S300. The pre-treatment step S100, the coating step S200, and the post-treatment step S300 according to an embodiment may be performed in the order of time series.

In the pre-treatment step S100 according to an embodiment, a first liquid may be supplied to the substrate W. In the coating step S200, a second liquid may be supplied to the substrate W. In addition, in the post-treatment step S300, the first liquid may be supplied to the substrate W. Accordingly, the pre-treatment step S100 and the post-treatment step S300 may be defined as a first liquid treating step, and the coating step S200 may be defined as a second liquid treating step. In addition, the pre-treatment step S100 may be defined as the first liquid treating step performed before the coating step S200. In addition, the post-treatment step S300 may be defined as the first liquid treating step performed after the coating step S200. However, hereinafter, for convenience of understanding, the first liquid treating step performed before the coating step S200 is referred to as the pre-treatment step S100, and the first liquid treating step performed after the coating step S200 is referred to as the post-treatment step S300.

According to an embodiment, in the pre-treatment step S100, the first nozzle 441 may supply the first liquid to the substrate W. In addition, in the coating step S200, the second nozzle 442 may supply the second liquid to the substrate W. In addition, in the post-treatment step S300, the third nozzle 444 may supply the first liquid to the substrate W. In addition, the support unit 430 may rotate the substrate W while supplying a liquid to the substrate W. In addition, the support unit 430 may change a rotation direction of the substrate W in any partial section for supplying the liquid to the substrate W.

The pre-treatment step S100 according to an embodiment may include a first supply step S120, a first puddle step S140, a first removal step S150, a second supply step S160, a second puddle step S180, and a second removal step S190. The first supply step S120, the first puddle step S140, the first removal step S150, the second supply step S160, the second puddle step S180 and the second removal step S190 may be sequentially performed.

In the first supply step S120, the first liquid L1 is supplied to a center region of a rotating substrate W. The first liquid L1 supplied to the center region of the substrate W is uniformly coated on an entire region of the substrate W by a centrifugal force. As shown in FIG. 8 and FIG. 10, in the first supply step S120, the substrate W may rotate in a first direction CCW. More specifically, in the first supply step S120, the substrate W may rotate in a first direction CCW with an axis C as a rotation axis. The axis C according to an embodiment may be a central axis of the rotation shaft 434 described above. In addition, the first direction CW according to an embodiment may be a counterclockwise direction. As shown in FIG. 9, in the first supply step S120, the substrate W may rotate at a first rotation speed V1. The first rotation speed V1 may be an average rotation speed of the substrate W in a section of the first supply step S120. The first rotation speed V1 may be about 1000 RPM to 1500 RPM. If necessary, the first rotation speed V1 may be 0 to 30 RPM.

In the first puddle step S140, the substrate W is rotated to form a liquid film on the substrate W. More specifically, the substrate W is rotated in the first direction CCW to form a liquid film (puddle) on the substrate W. In the first puddle step S140, the substrate W is rotated at a third rotation speed V3. The third rotation speed V3 according to an embodiment may be an average rotation speed of the substrate W in the first puddle step S140. The third rotation speed V3 may be slower than the first rotation speed V1 in the first supply step S120. In addition, the third rotation speed V3 may be slower than the second rotation speed V2 in the second supply step S160 to be described later. The third rotation speed V3 may be about 0 to 30 RPM.

In the first removal step S150, at least a part of the liquid film formed on the substrate W may be removed by rotating the substrate W. In the first removal step S150, the substrate W may be rotated in the first direction CCW. In the first removal step S150, while a supply of the first liquid L1 is stopped, the substrate W can be rotated at a fourth rotation speed V4, which is faster than the first puddle step S140, and the liquid film formed on the substrate W can be dried or scattered. The fourth rotation speed V4 in the first removal step S150 may be about 1000 to 1500 RPM.

In the second supply step S160, the first liquid L1 is supplied to the center region of the rotating substrate W. The first liquid L1 is uniformly coated on the entire region of the substrate W by a centrifugal force. As illustrated in FIG. 8 and FIG. 11, in the second supply step S160, the substrate W may rotate in a second direction CW opposite to the first direction CCW. The second direction CW according to an embodiment may be a clockwise direction. That is, the rotation direction of the substrate W may be changed in the second supply step S160.

In addition, as shown in FIG. 9, the substrate W may rotate at a second rotation speed V2 in the second supply step S160. The second rotation speed V2 according to an embodiment may be an average rotation speed of the substrate W in the second supply step S140. The second rotation speed V2 according to an embodiment may be slower than the first rotation speed V1, which is an average rotation speed of the substrate W in the first supply step S120. However, the inventive concept is not limited thereto, and the second rotation speed V2 according to an embodiment may be the same speed as the first rotation speed V1.

In the second puddle step S180, a liquid film is secondarily formed on the substrate W by rotating the substrate W. More specifically, in the second puddle step S180, the substrate W is rotated in the second direction (e.g., clockwise direction) to form a liquid film on the substrate W again. In the second puddle step S140, the substrate W is rotated at a third rotation speed V3.

In the second removal step S190, at least a part of the liquid film formed on the substrate W may be removed by rotating the substrate W. In the second removal step S190, the substrate W may be rotated in the second direction CW. In the second removal step S190, while the supply of the first liquid L1 is stopped, the substrate W can be rotated at a fourth rotation speed V4, which is faster than the second puddle step S180, to dry or scatter the liquid film formed on the substrate W. The fourth rotation speed V4 in the second removal step S190 may be about 1000 to 1500 RPM.

In the above-described example, the rotation speed of the substrate W in the first removal step S150 and the rotation speed of the substrate W in the second removal step S190 have been the same, but are not limited thereto. For example, the rotation speed of the substrate W in the first removal step S150 and the rotation speed in the second removal step S190 may be different from each other. In addition, the rotation speed of the substrate W in the first removal step S150 and the rotation speed in the second removal step S190 can be varied if the speed is suitable for drying or scattering the liquid film formed on the substrate W.

As illustrated in FIG. 10, the first liquid L1 supplied to the substrate W in the first supply step S120 penetrates into a space between the patterns P formed on the substrate W. In this case, since the substrate W rotates in the first direction CCW, the first liquid L1 flows in a direction by a centrifugal force. Accordingly, the first liquid L1 intensively penetrates only some spaces facing a direction in which the first liquid L1 flows among spaces between the patterns P. An air may be trapped in another space among the spaces between the patterns P at which the first liquid L1 cannot easily penetrate, thereby forming an air void.

As illustrated in FIG. 11, in the second supply step S160, the first liquid L1 supplied onto the substrate W penetrates again into the space between the patterns P. In this case, since the substrate W rotates in the second direction CW, the first liquid L1 supplied to the substrate W flows in a direction opposite to the direction in which the first liquid L1 flows in the first supply step S120. Accordingly, the first liquid L1 may penetrate intensively into a space facing a direction in which the first liquid L1 flows in the space between the patterns P. That is, the first liquid L1 supplied in the second supply step S160 may penetrate into a space in which the first liquid L1 supplied in the first supply step S120 does not easily penetrate. Accordingly, in the first supply step S120, the air void V that may be formed in the space between the patterns P may be removed by the first liquid L1 supplied in the second supply step S160.

As a result, the first liquid L1 may uniformly penetrate between the patterns P and the first liquid L1 may be uniformly coated on the entire region of the substrate W. Accordingly, in the subsequent coating step S200, an adhesive force between the substrate W and the second liquid may be increased. In addition, a reactivity between the substrate W and the second liquid having hydrophobic properties in the coating step S200 may be improved. In addition, in the coating step S200, a concentration of the second liquid according to a recipe may be easily adjusted. In addition, in the subsequent process, the air void V which can be a source of the particle can be reliably removed from the substrate W.

In addition, according to the above-described example, in the second supply step S160, the substrate W rotates at the second rotation speed V2 equal to or slower than the first rotation speed V1, so that the first liquid supplied to the substrate W can penetrate more easily between the patterns of the substrate W. The first liquid penetrating through the patterns easily removes the air void V remaining between the patterns of the substrate W from the substrate W.

In the coating step S200 according to an embodiment, the second liquid is supplied to the center region of the rotating substrate W. As shown in FIG. 8, in the coating step S200, the second liquid is supplied to the substrate W rotating in the first direction (e.g., counterclockwise direction). That is, after the second removal step S190 is performed, a rotation direction of the substrate W may be changed again. The second liquid supplied to the center region of the substrate W may be uniformly coated on the entire region of the substrate W by a centrifugal force.

In the post-treatment step S300, the first liquid is supplied to the edge region of the substrate W rotating in the first direction CCW. The first liquid supplied to the edge region of the substrate W removes the second liquid remaining in the edge region of the substrate W. That is, in the post-treatment step S300, a bead formed by the second liquid flowing down to the edge area of the substrate W in the coating step S200 is removed.

Unlike the above-described example, the pre-treatment step S100 may sequentially perform the first supply step S120, the second supply step S160 and the second puddle step S180. That is, while supplying the first liquid to the rotating substrate W, the rotation direction of the substrate W may be changed.

Hereinafter, a substrate treating method according to another embodiment of the inventive concept will be described. The substrate treating method described below is mostly the same as or similar to the mechanism of the substrate treating method described above, except for the case to be further described. Accordingly, the description of the overlapping content will be omitted.

Figure 12:
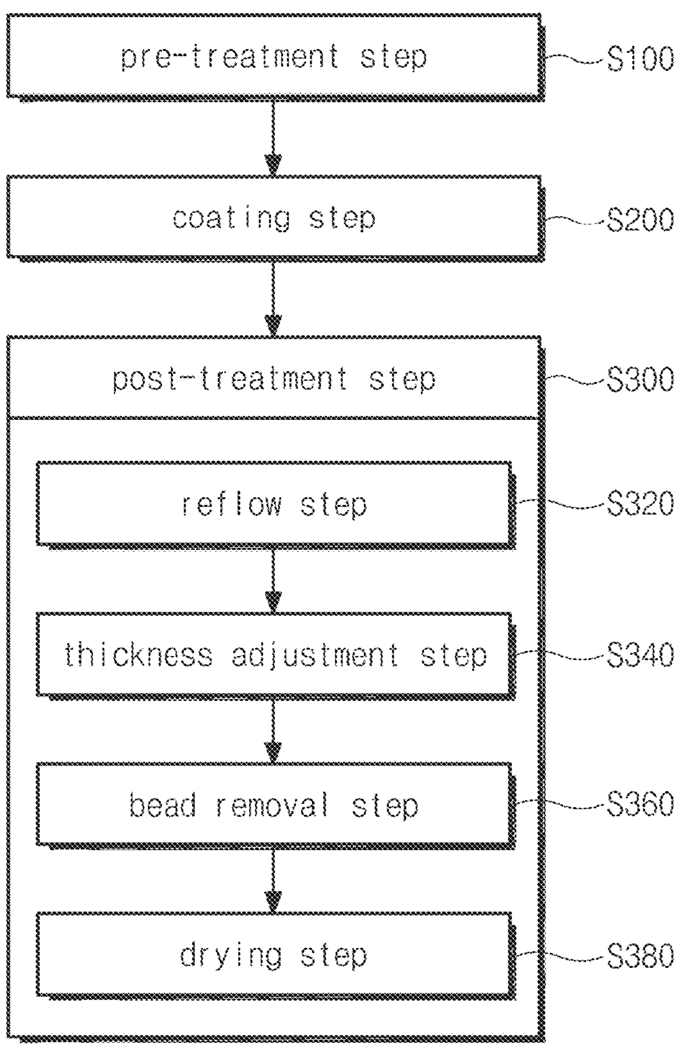
FIG. 12 is a flowchart of the substrate treating method according to another embodiment.
Figure 13:
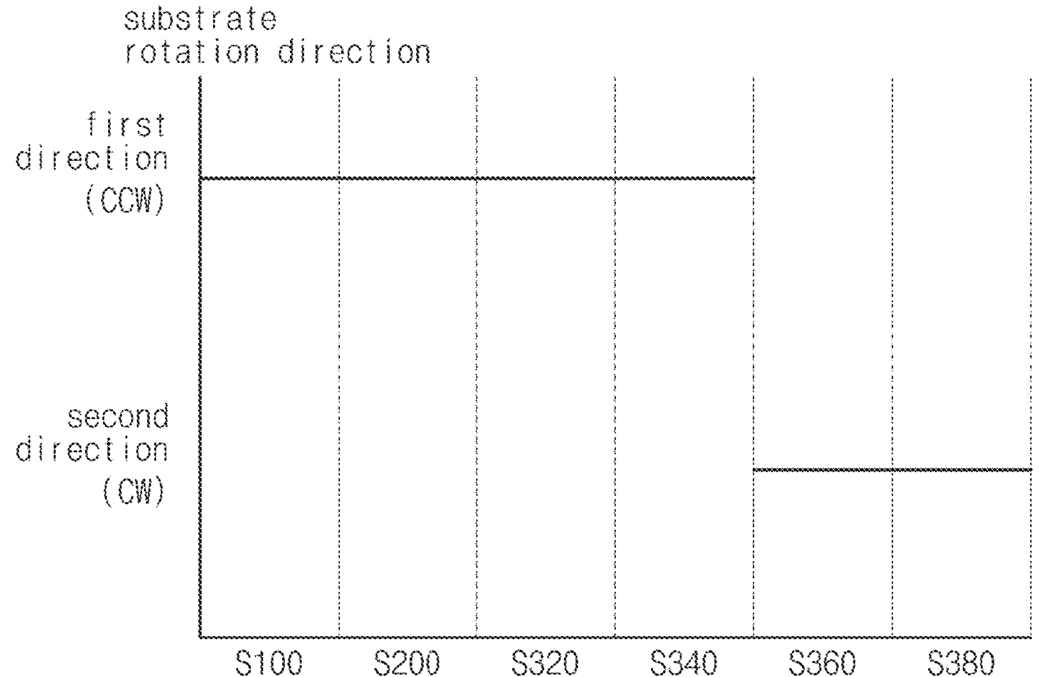
FIG. 13 is a graph illustrating a direction in which the substrate rotates while performing the substrate treating method of FIG. 12.

FIG. 12 is a flowchart of the substrate treating method according to another embodiment. FIG. 13 is a graph illustrating a direction in which the substrate rotates while performing the substrate treating method of FIG. 12.

The substrate treating method according to an embodiment may include a pre-treatment step S100, a coating step S200, and a post-treatment step S300.

In the pre-treatment step S100, the first liquid is supplied to the rotating substrate W. More specifically, in the pre-treatment step S100, the first liquid is supplied to the center region of the substrate W rotating in the first direction CCW for a set time. After the set time elapses, a supply of the first liquid is stopped, and the substrate W is rotated in the first direction to form a liquid film on the substrate W. Thereafter, at least a portion of the liquid film formed on the substrate W may be removed by rotating the substrate W in the first direction. That is, in the pre-treatment step S100 according to an embodiment, the rotation direction may not be changed. In addition, while supplying the first liquid to the substrate W in the pre-treatment step S100 according to an embodiment, the rotation speed of the substrate W may be constant.

In the coating step S200, the second liquid is supplied to the center region of the substrate rotating in the first direction CCW. Since the coating step S200 according to an embodiment is mostly performed by the same or similar mechanism as the coating step S200 described with reference to FIG. 7 to FIG. 11, a description thereof will be omitted.

The post-treatment step S300 may be performed after the coating step S200. The post-treatment step S300 may include a reflow step S320, a thickness adjustment step S340, a bead removal step S360, and a drying step S380. In the post-treatment step S300, the reflow step S320, the thickness adjustment step S340, the bead removal step S360, and the drying step S380 may be performed in the order of time series.

In the reflow step S320, the substrate W is rotated to diffuse the second liquid supplied to the substrate W in the coating step S320. That is, in the coating step S320, the second liquid supplied to the center region of the substrate W is uniformly diffused to the edge region of the substrate W. As the reflow step S320 is performed, the second liquid may be uniformly coated on the substrate W. In the reflow step S320 according to an embodiment, the substrate W may be rotated in the first direction CCW. The first direction CCW according to an embodiment may be the counterclockwise direction.

In the thickness adjustment step S340, a thickness of the second liquid coated on the substrate W is adjusted by rotating the substrate W. A rotation speed of the substrate W in the thickness adjustment step S340 may be relatively faster than a rotation speed of the substrate W in the reflow step S320. In addition, in the thickness adjustment step S340, the substrate W may be rotated in the first direction CCW.

In the bead removal step S360, the first liquid is supplied to the rotating substrate W. More specifically, in the bead removal step S360, the second liquid is supplied to the edge region of the substrate W rotating in the second direction CW. The second direction CW according to an embodiment may be the clockwise direction. That is, in the bead removal step S360, the rotation direction of the substrate W may be changed. In the bead removal step S360, the first liquid is supplied to the edge region of the substrate W to remove the second liquid remaining in the edge region of the substrate W. That is, in the bead removal step S360, the bead formed by the second liquid flowing down to the edge region of the substrate W in the coating step S200 is removed.

Subsequently, in the drying step S380, the substrate W is rotated to remove the first liquid remaining on the substrate W. According to an embodiment, in the drying step S380, the rotation direction of the substrate W may be the second direction CW. In addition, a rotation speed of the substrate W in the drying step S380 may be relatively faster than a rotation speed of the substrate W in the thickness control step S340.

As described above, in general, if the liquid is supplied to the substrate W while the substrate W is rotated in a direction, the liquid may penetrate intensively into only a part of the space between the patterns. This phenomenon is more severe in the edge region of the substrate W than in the center region of the substrate W. That is, air voids may be formed more frequently in the edge region of the substrate W. According to the above-described embodiment, in the bead removal step S360 of supplying the first liquid to the edge region of the substrate W, the rotation direction of the substrate W is changed to efficiently penetrate the first liquid into a space in which the liquid does not penetrate. Accordingly, it is possible to efficiently remove the air void remaining on the substrate W by efficiently penetrating the first liquid between the patterns. In addition, it is possible to efficiently remove beads formed in the edge region of the substrate W by efficiently penetrating the first liquid between the patterns. Accordingly, a formation of particles by the second liquid attached to a bottom surface of the edge region of the substrate W may be minimized in a subsequent exposing process.

Figure 14:
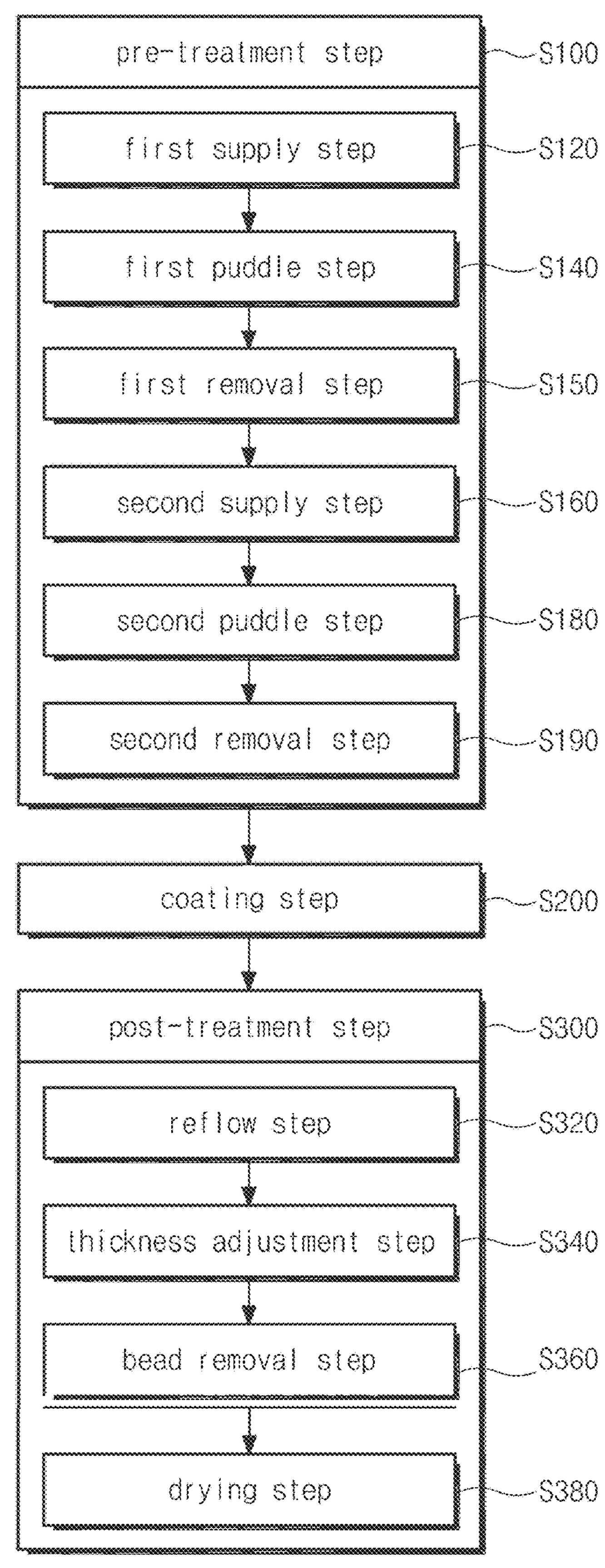
FIG. 14 is a flowchart of the substrate treating method according to another embodiment.
Figure 15:
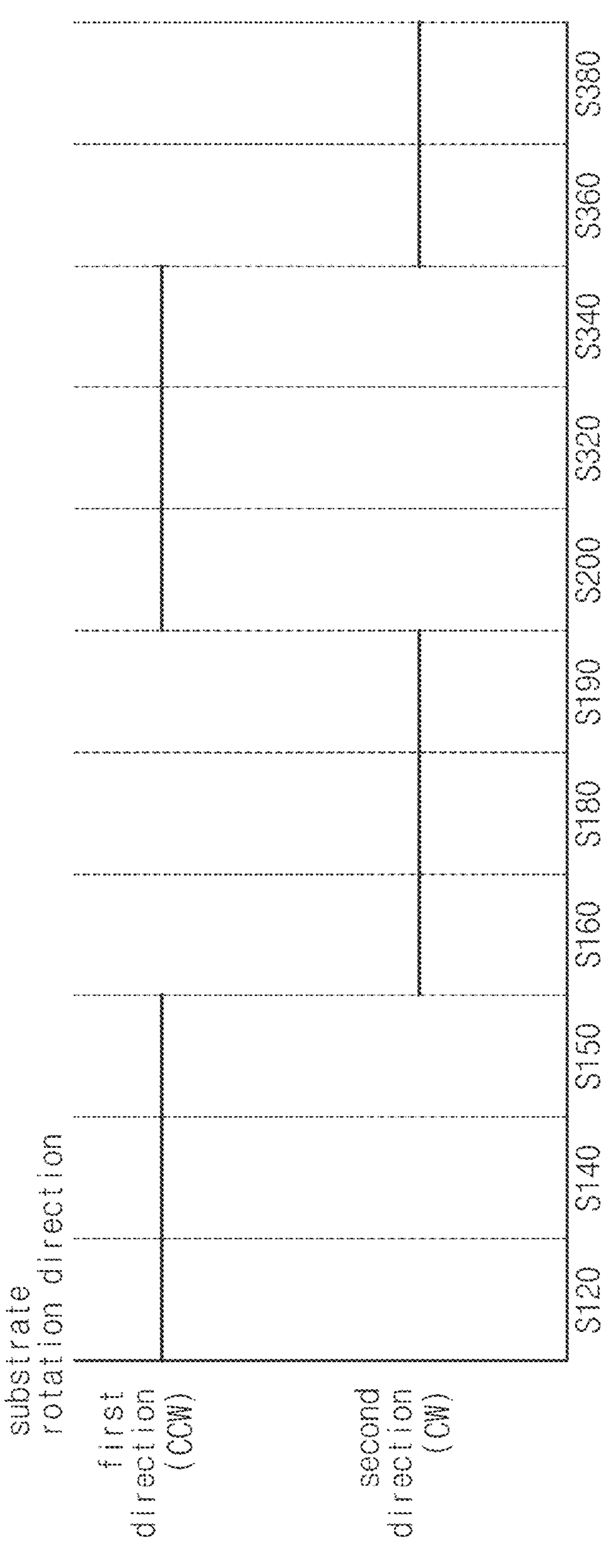
FIG. 15 is a graph illustrating a direction in which the substrate rotates while performing the substrate treating method of FIG. 14.

FIG. 14 is a flowchart of a substrate treating method according to another embodiment. FIG. 15 is a graph illustrating a direction in which a substrate rotates while performing the substrate treating method of FIG. 14.

The substrate treating method according to an embodiment may include a pre-treatment step S100, a coating step S200, and a post-treatment step S300. The pre-treatment step S100, the coating step S200, and the post-treatment step S300 may be sequentially performed.

In addition, the pre-treatment step S100 according to an embodiment may be performed by the same or similar mechanism as the pre-treatment step S100 described with reference to FIG. 7 to FIG. 11, and the post-treatment step S300 according to an embodiment may be performed by the same or similar mechanism as the post-treatment step S300 described with reference to FIG. 12 to FIG. 13.

That is, in the first supply step S120, the first puddle step S140, the first removal step S150, the coating step S200, the reflow step S320, and the thickness adjustment step S340 according to an embodiment, the substrate W may rotate in the first direction CCW. On the contrary, in the second supply step S160 according to an embodiment, the second puddle step S180, the second removal step S190, the bead removal step S360 and the drying step S380 may rotate in the second direction CW opposite to the first direction. According to an embodiment of the inventive concept, the air void which remains in the space between patterns formed on the substrate W may be more reliably removed from the substrate W.

In the above-described embodiments, the purpose has been described that the first direction may be the counterclockwise direction and the second direction may be the clockwise direction, but the inventive concept is not limited thereto. For example, the first direction may be the clockwise direction, and the second direction may be the counterclockwise direction.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating method comprising:
supplying a first liquid to a rotating substrate to treat a substrate; and
supplying a second liquid which is different from the first liquid to the rotating substrate to coat the substrate with the second liquid, and
wherein a rotation direction of the substrate is different at the supplying the first liquid and at the supplying the second liquid, liquid,
wherein the supplying the first liquid includes
firstly supplying the first liquid on the rotating substrate to form a liquid film on the substrate, and
secondly supplying the first liquid on the substrate having the liquid film formed thereon, after the firstly supplying the first liquid,
wherein the firstly supplying the first liquid and the secondly supplying the first liquid is performed before the supplying the second liquid,
wherein the substrate is rotated in a first direction at the firstly supplying the first liquid and the supplying the second liquid, and
the substrate is rotated in a second direction which is different from the first direction at the secondly supplying the first liquid.

2. The substrate treating method of claim 1, wherein an average rotation speed of the substrate at the firstly supplying the first liquid is same or faster than an average rotation speed of the substrate at the secondly supplying the first liquid.

3. The substrate treating method of claim 1, wherein the substrate is rotated at a first rotation speed and supplied with the first liquid at the firstly supplying the first liquid, and
the substrate is rotated at a second rotation speed and supplied with the first liquid at the secondly supplying the first liquid, and
wherein the supplying the first liquid further includes:
firstly forming a liquid film on the substrate by rotating the substrate at a speed slower than the first rotation speed in a state at which a supply of the first liquid is stopped and which is performed after the firstly supplying the first liquid and before the secondly supplying the first liquid;
firstly removing the liquid film formed on the substrate by rotating the substrate at a speed faster than the firstly forming the liquid film on the substrate in a state at which the supply of the first liquid is stopped and which is performed after the firstly forming the liquid film on the substrate and before the secondly supplying the first liquid;
secondly forming the liquid film on the substrate by rotating the substrate at a speed slower than the second rotation speed in a state at which the supply of the first liquid is stopped and which is performed after the supplying the first liquid and before the supplying the second liquid; and
secondly removing the liquid film formed on the substrate by rotating the substrate at a speed faster than the secondly forming the liquid film in a state at which the supply of the first liquid is stopped and which is performed after the secondly forming the liquid film and before the supplying the second liquid.

4. The substrate treating method of claim 1, wherein the supplying the first liquid is performed before and after the supplying the second liquid, and
the supplying the first liquid which is performed after the supplying the second liquid is performed by supplying the first liquid on the rotating substrate to remove the second liquid which is remaining on an edge region of the substrate.

5. The substrate treating method of claim 4, wherein the substrate is rotated in the first direction at each of the supplying the first liquid which is performed before the supplying the second liquid and the supplying the second liquid, and
the substrate is rotated in the second direction which is an opposite direction of the first direction at the supplying the first liquid which is performed after the supplying the second liquid.

6. The substrate treating method of claim 5, further comprising:
diffusing the second liquid which is supplied to the substrate by rotating the substrate which is performed between the supplying the second liquid and the supplying the first liquid which is performed after the supplying the second liquid.

7. The substrate treating method of claim 6, further comprising:
removing the first liquid which is supplied onto the substrate from the substrate by rotating the substrate after the supplying the first liquid which is performed after the supplying the second liquid.

8. The substrate treating method of claim 4, wherein the first liquid is supplied to a center region of the substrate at the supplying the first liquid which is performed before the supplying the second liquid, and
the first liquid is supplied to an edge region of the substrate at the supplying the first liquid which is performed after the supplying the second liquid.

9. The substrate treating method of claim 1, wherein the first liquid is a thinner, and the second liquid is a photoresist liquid.

10. The substrate treating method of claim 1, wherein an air void remaining between patterns formed on the substrate is removed by changing the rotation direction of the substrate.

11. A substrate treating method comprising:
hydrophilizing a substrate by supplying a thinner to a rotating substrate;
coating the substrate with a photoresist liquid by supplying the photoresist liquid to the rotating substrate; and
post-treating the substrate, and
wherein the post-treating the substrate includes
diffusing the photoresist liquid supplied onto the substrate by rotating the substrate,
adjusting a thickness of the photoresist liquid supplied to the substrate by rotating the substrate,
removing the photoresist liquid remaining on an edge region of the substrate by supplying the thinner on the rotating substrate, and
removing the thinner from the substrate by rotating the substrate,
wherein a rotation direction of the substrate is changed at any one of the hydrophilizing the substrate or the post-treating the substrate,
wherein the hydrophilizing the substrate includes
firstly supplying the thinner to the rotating substrate to form a liquid film on the substrate, firstly forming the liquid film on the substrate by rotating the substrate in a state in which a supply of the thinner is stopped, secondly supplying the thinner to the substrate on which the liquid film is formed after the firstly supplying the liquid film, and secondly forming the liquid film on the substrate by rotating the substrate in a state in which the supply of the thinner is stopped, wherein the substrate is rotated in a first direction at each of the firstly supplying the thinner, the firstly forming the liquid film, the coating the substrate, the diffusing the photoresist liquid, and the post-treating the substrate, and the substrate is rotated in a second direction which is an opposite direction from the first direction at each of the secondly supplying the thinner and the secondly forming the liquid film.

12. A substrate treating method comprising:

hydrophilizing a substrate by supplying a thinner to a rotating substrate;

coating the substrate with a photoresist liquid by supplying the photoresist liquid to the rotating substrate; and post-treating the substrate, wherein the post-treating the substrate includes diffusing the photoresist liquid supplied onto the substrate by rotating the substrate, adjusting a thickness of the photoresist liquid supplied to the substrate by rotating the substrate, removing the photoresist liquid remaining on an edge region of the substrate by supplying the thinner on the rotating substrate, and removing the thinner from the substrate by rotating the substrate wherein a rotation direction of the substrate is changed at any one of the hydrophilizing the substrate or the post-treating the substrate, and wherein the substrate rotates in a first direction at each of the hydrophilizing the substrate, the coating the substrate, the diffusing the photoresist liquid, and the adjusting the thickness, and the substrate rotates in a second direction which is an opposite direction of the first direction at the removing the photoresist liquid and the removing the thinner.

* * * * *